United States Patent [19]

Vinouze et al.

[11] Patent Number: 5,015,597
[45] Date of Patent: May 14, 1991

[54] PROCESS FOR THE PRODUCTION OF AN INVERTED STRUCTURE, ACTIVE MATRIX DISPLAY SCREEN

[75] Inventors: Bruno Vinouze, Penvenan; Yannick Chouan, Perros Guirec, both of France

[73] Assignee: French State represented by the Minister of Post, Telecommunications and Space (Centre National D'Etudes Des), Issy les Moulineaux, France

[21] Appl. No.: 573,340

[22] Filed: Aug. 24, 1990

[30] Foreign Application Priority Data

Aug. 29, 1989 [FR] France ................. 89 11331

[51] Int. Cl.$^5$ ............. H01L 21/312; H01L 21/308; G03C 5/00; G02F 1/133
[52] U.S. Cl. ................................. 437/41; 437/101; 357/23.7; 350/333; 350/339 R
[58] Field of Search .............. 437/41, 101; 357/23.7; 350/330, 332, 333, 334, 335, 339 R, 340, 341, 344

[56] References Cited

U.S. PATENT DOCUMENTS

| | | | |
|---|---|---|---|
| 4,684,435 | 8/1987 | Kishi et al. | 156/632 |
| 4,741,601 | 5/1988 | Saito | 350/339 R |
| 4,783,147 | 11/1988 | Maurice et al. | 350/333 |
| 4,788,157 | 11/1988 | Nakamura | 437/101 |
| 4,790,630 | 12/1988 | Maurice | 350/333 |
| 4,820,024 | 4/1989 | Nishiura | 350/333 |
| 4,836,650 | 6/1989 | Morin et al. | 350/339 R |
| 4,904,056 | 2/1990 | Castleberry | 350/333 |
| 4,918,504 | 4/1990 | Kato et al. | 357/23.7 |
| 4,948,706 | 8/1990 | Sugihara et al. | 350/339 R |

FOREIGN PATENT DOCUMENTS

| | | | |
|---|---|---|---|
| 0236169 | 9/1987 | European Pat. Off. | 350/333 |
| 3604368 | 2/1986 | Fed. Rep. of Germany . | |
| 0139069 | 6/1986 | Japan | 437/41 |
| 0112127 | 5/1987 | Japan | 350/339 R |
| 0239524 | 9/1989 | Japan | 350/339 R |
| 2077039 | 6/1981 | United Kingdom . | |

Primary Examiner—Olik Chaudhuri
Assistant Examiner—M. Wilczewski
Attorney, Agent, or Firm—Hayes, Soloway, Hennessey & Hage

[57] ABSTRACT

Process for producing a wall for an active matrix display screen.

By a first etching is formed stack rows of layers (L) with a metal at the bottom. The gaps between the rows are filled by a negative polyimide. On the surface are etched columns (C) and blocks (P). These elements serve as a mask for an etching leaving control transistors in a gate configuration below the same.

Application to the production of liquid crystal display screens.

7 Claims, 5 Drawing Sheets

PROCESS FOR THE PRODUCTION OF AN INVERTED STRUCTURE, ACTIVE MATRIX DISPLAY SCREEN

BACKGROUND OF THE INVENTION

The present invention relates to a process for the production of an inverted structure, active matrix display screen. Its preferred use is in the production of liquid crystal flat-faced screens. However, it can also be applied to materials other than liquid crystals, such as electroluminescent, electrochromic, electrolytic and similar materials.

Among the most interesting known processes for producing an active matrix display screen is the so-called two masking level process, as described in French patent application FR-A-2 533 072. In such a process on a transparent wall are produced columns and a matrix of blocks defining the future pixels. Deposition takes place of a stack of three layers, namely of amorphous hydrogenated silicon, insulant and conductor and said stack is etched with rows overlapping the columns and blocks. Therefore a transistor is formed at each overlap with, as the gate the conductive part of the row, as the drain the block and as the source the column. Thus, the gate is placed above the structure, in a so-called "normal" configuration.

The article by Yutaka Miya et al entitled "Two-Mask Step-Inverted Staggered a-Si TFT-Addressed LCDs" published in SID (Society for Information Display) 89 Digest, pp. 155 to 158 describes another process, which also has two masking levels, but which leads to an inverted or reversed structure compared with the structure described hereinbefore, i.e. with a gate positioned at the bottom of the stack of layers. The main stages of this process are illustrated in FIG. 1. On a glass support 1 is deposited a conductive layer, e.g. of chromium, which is etched in the form of parallel rows 2 (part A). This is followed by the deposition of a silicon nitride layer 3, an intrinsic amorphous silicon layer 4 and a doped amorphous silicon layer 5. These layers can be deposited by PECVD (Plasma Enhanced Chemical Vapour Deposition). A positive photoresist 6 is then deposited and the assembly is subject to ultraviolet irradiation through the glass substrate (part B). In this irradiation operation, the conductive lines or rows constitute an opaque mask so that after development photoresist 7 is only left above the rows 2. These photoresist rows or lines 7 are used as a mask for etching the doped amorphous silicon layer 5 and the intrinsic amorphous silicon layer 4 (part C).

This is followed by the deposition thereon of a conductive layer 8 etched in order to form the columns and blocks which overlap the rows 2 (part D—the representation being diagrammatic). Taking these elements as the mask, the doped amorphous silicon layer 5 is etched in order to reach the intrinsic amorphous silicon layer 4, which completes the transistors. The latter have for the gate G the part of the row 2 located beneath the structure, for the source S the end of the block and for the drain D part of the column (part E).

This procedure suffers from two disadvantages. Firstly the irradiation takes place through the stack formed by the silicon nitride layer 3, the intrinsic amorphous silicon layer 4 and the doped amorphous silicon layer 5. It is therefore necessary to limit these layers to a very limited thickness in order to avoid an excessive absorption, particularly with respect to the intrinsic amorphous silicon layer 4, which absorbs ultraviolet rays. However, as a result of the thinness of the layer the transistors obtained have only mediocre performance characteristics. The other disadvantage is that the metallic layer for forming the columns and blocks is not deposited on a planar surface (parts C and D of FIG. 1), being instead deposited on a surface having reliefs. This leads to the risk of defects, particularly the cutting off of columns.

SUMMARY OF THE INVENTION

The object of the present invention is to avoid these disadvantages. It therefore proposes a process having two masking levels leading to an inverted structure, but which imposes no constraint regarding the thickness of the semiconductor layers and which avoids the use of a non-planar surface for receiving the columns and blocks.

To this end, the invention proposes a process differing from the aforementioned process essentially as a result of the fact that the conductive layer deposited on the substrate is not immediately etched and instead the stack of layers is formed first. The entire stack undergoes the first etching. According to the invention use is made of a negative photosensitive material and not a positive material as in the prior art. Irradiation does not take place through the layer stack, because this has already been etched and instead only takes place through the glass, which obviates the disadvantage linked with the necessary thinness of the semiconductor layer. Moreover, the negative nature of the material reverses the result obtained, the material being left between the stack rows and thus ensures the planeity of the assembly. On said planar surface are deposited the columns and conductive blocks which will form the sources and drains of the transistors after a final etching using these elements as a mask.

Therefore the present invention specifically relates to a process for the production of a wall for an active matrix display screen, which is characterized in that it comprises the deposition on a transparent substrate of a stack of layers consisting of a first metallic layer, an insulating layer, a semiconducting layer, a highly doped semiconducting layer and optionally a second conductive layer, a first photoetching takes place through a first masking level so as to only leave the stack rows, the assembly is covered with negative photosensitive material to obtain, between the stack rows, a layer of the same thickness as the stack thickness, said layer is dried, the assembly is then irradiated through the transparent substrate, the first metallic layer of the stack rows serving as an opaque mask and the non-irradiated resin located above the stack rows is removed, said resin only being left between the stack rows and the assembly is planarized, said resin is annealed, a transparent conductive layer is deposited on the assembly, said layer undergoes photoetching in order to form a second masking level defining columns and blocks provided with a finger parallel to the columns, the columns and fingers of the blocks overlapping the stack rows and following the elimination of the photoetching resin use is made of the columns and the blocks and their fingers as the mask for etching the second metallic layer and the doped semiconducting layer, which leaves behind transistors having as the gate the first metallic layer deposited on the substrate, as the drain the block finger, as the source the column and as the channel the semiconducting layer beneath the etched zone between the column and the block finger.

Preferably, the insulant of the insulating layer is silicon nitride (SiN) and the semiconductor of the semiconducting layer amorphous hydrogenated silicon (aSiH).

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1A:
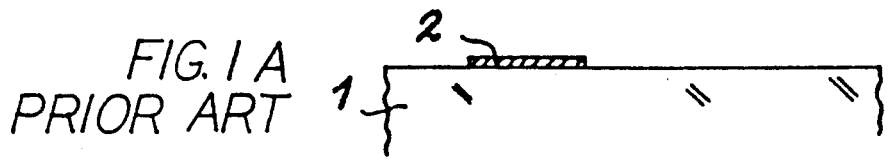
FIGS. 1A–E already described, various stages of the prior art production process.
Figure 1B:
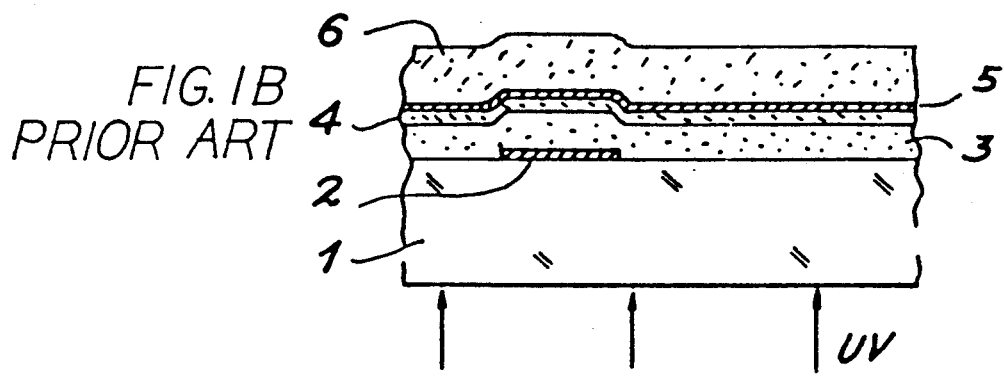
Figure 1C:
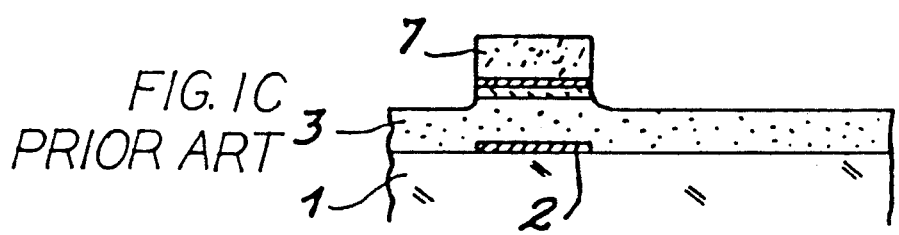
Figure 1D:
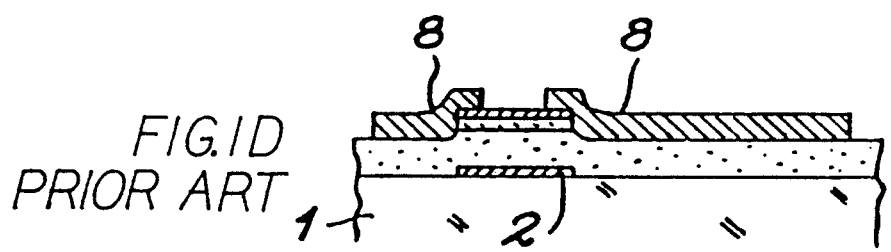
Figure 1E:
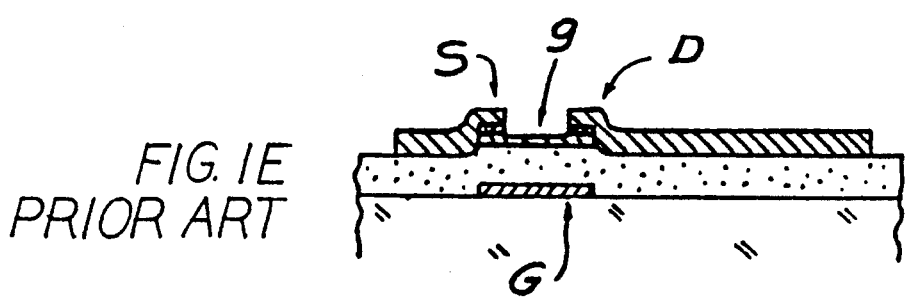
Figure 2:
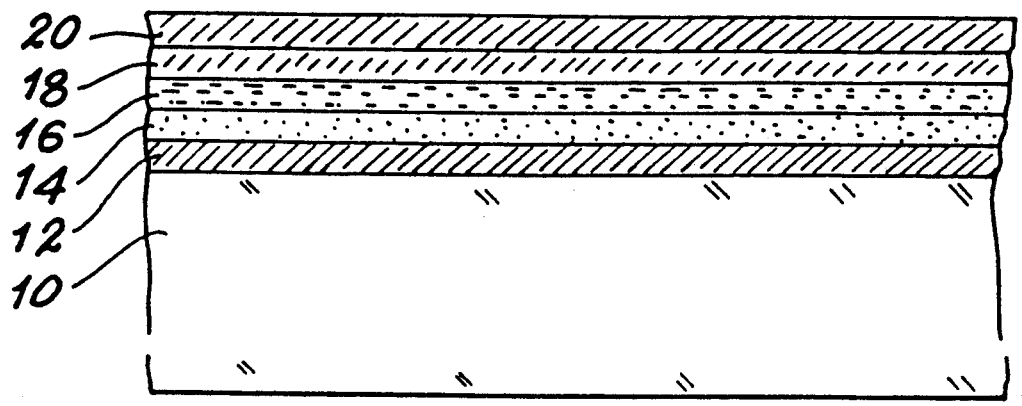
FIG. 2 in section, a stack of layers on a glass substrate.

FIG. 2 shows, in section, a glass substrate 10 on which are deposited a metallic layer 12 (the metal being e.g. chromium, tantalum, molybdenum, tungsten, etc.), an insulating layer 14, e.g. of silicon nitride, a semiconducting layer 16, e.g. of amorphous hydrogenated silicon, a n+ doped semiconducting layer 18, e.g. of silicon and optionally a metallic layer 20.

The layers 14, 16 and 18 can be deposited by PECVD (Plasma Enhanced Chemical Vapour Deposition) and in the same cycle.

Figure 3:
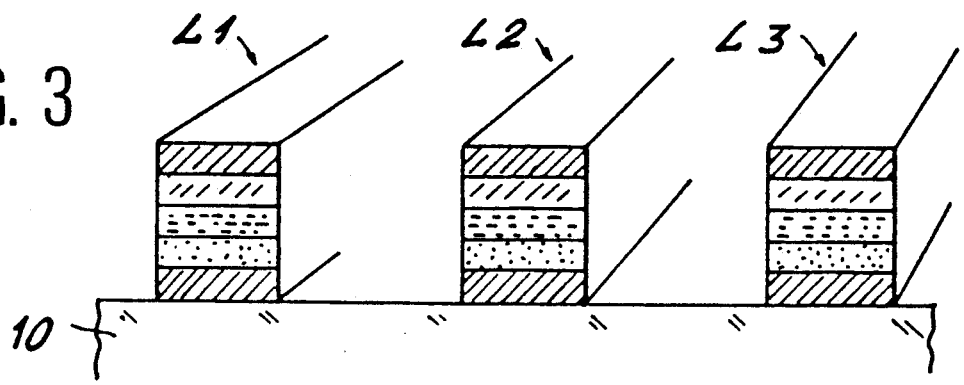
FIG. 3 in section, an assembly of rows following a first etching.

For illustrative purposes, the thickness of these layers can be 200 to 300 nm for layer 12, 300 nm for layer 13, 50 nm for layer 16, 100 nm for layer 18 and 200 nm for layer 20, i.e. in all a stack of approximately 1.2 to 1.3 $\mu$m. This stack is photoetched in accordance with FIG. 3, so as to only leave behind the stack lines L1, L2, L3, etc. This operation corresponds to the first masking level and to the first etching.

Figure 4:
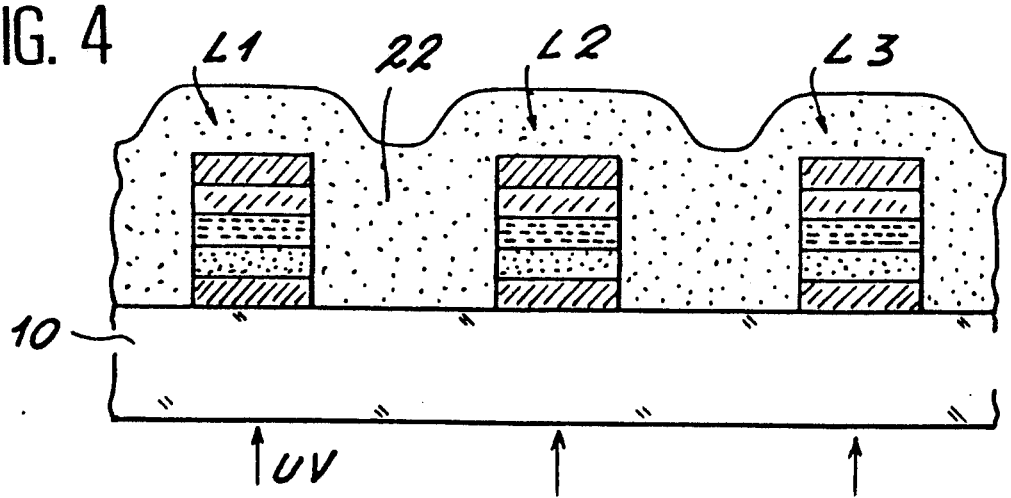
FIG. 4 in section, the deposition of a negative photosensitive resin layer with irradiation from the rear.

According to FIG. 4, the substrate carrying the rows is covered with negative photosensitive material 22, e.g. a negative polyimide, such as product PI 2701 D of du Pont de Nemours, or product HTR 350 of Merck. This polyimide is spread e.g. with a whirler in a thickness equal to the height of the stack, i.e. approximately 1 $\mu$m.

Figure 5:
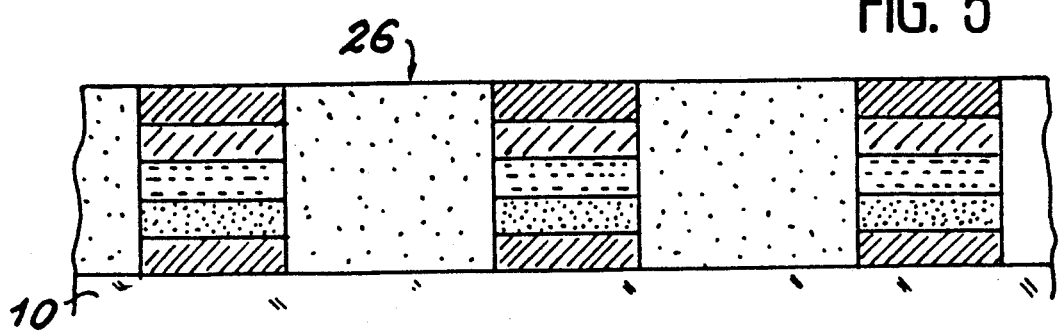
FIG. 5 a planarization stage.

The polyimide is irradiated after centrifuging and drying. It is for this purpose exposed to ultraviolet rays through the glass substrate. The conductor rows 12 and 20 act as optical masks. As the polyimide 22 is of the negative type, only the zones exposed to the ultraviolet rays are crosslinked (i.e. the zones located between the rows), whereas the masked zones (those located above the stacks) are eliminated by the developing agent. This gives the assembly of FIG. 5, without there being any need for a supplementary mask for this operation. The polyimide is then annealed in order to polymerize it. The maximum temperature compatible with the thus deposited layers is approximately 250° C. The upper surface 26 can then be planarized.

Figure 6:
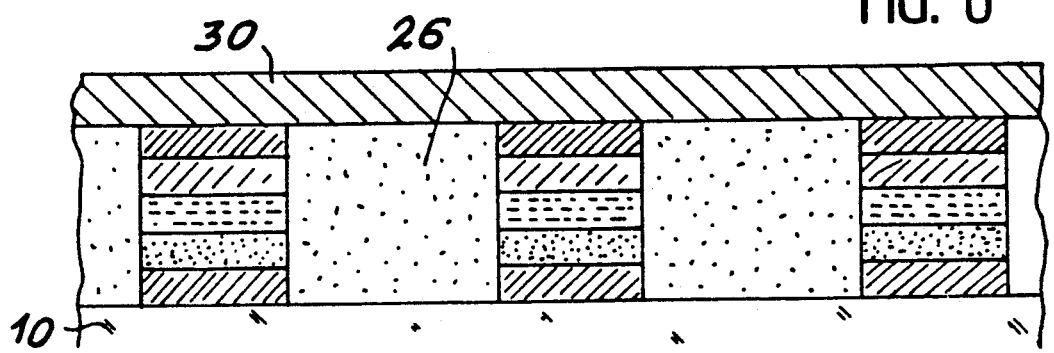
FIG. 6 in section, the deposition of a transparent conductive layer.
Figure 7:
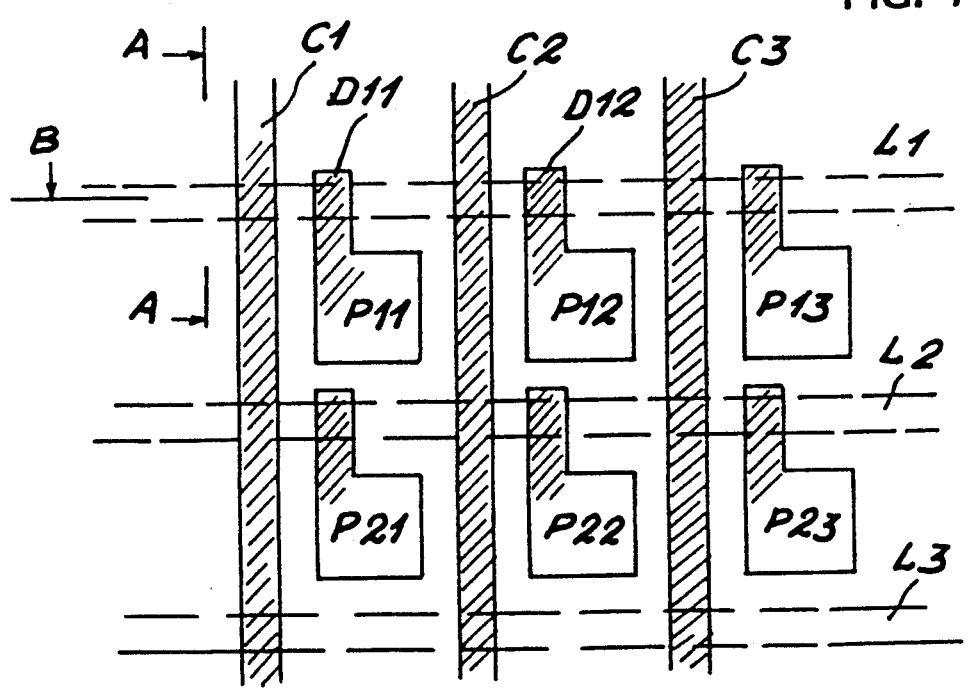
FIG. 7 in plan view, the etching of the columns and blocks.

This is followed by the deposition (FIG. 6) of a transparent conductive layer 30, e.g. of indium-tin oxide (ITO). This layer is then photoetched in order to define the columns and rectangular blocks corresponding to the future pixels of the screen. Thus, in FIG. 7 is possible to see the columns C1,C2,C3, etc., and the blocks P11,P12, etc., in the vicinity of the row L1, the blocks P21,P22, etc., in the vicinity of row L2, etc. Each rectangular block is extended by a finger, namely D11 for block P11, D12 for block P12, etc., said finger overlapping the row. In plan view, FIG. 7 shows the configuration of said second masking level.

Figure 8:
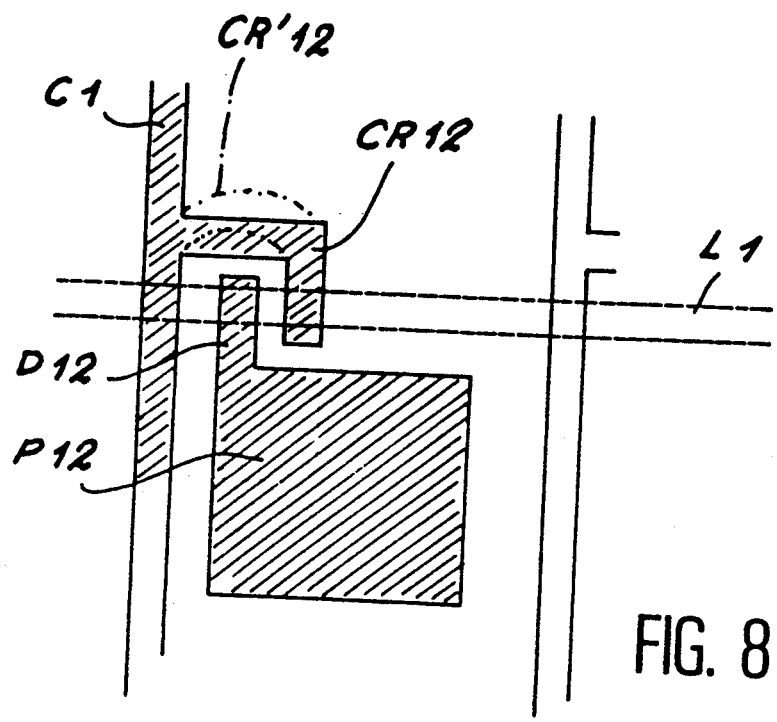
FIG. 8 in plan view, a variant of the etching pattern.

It is also possible to define supplementary segments called crooks, such as CR12, etc., shown in FIG. 8, which emanate from the column, pass round the end of the finger (D12) and overlap the row (L1), in such a way that the finger connected to the block is intercalated between the column and the crook. It is also possible to use a rounded shape CR'12, like that shown in broken line form in FIG. 8.

Figure 9:
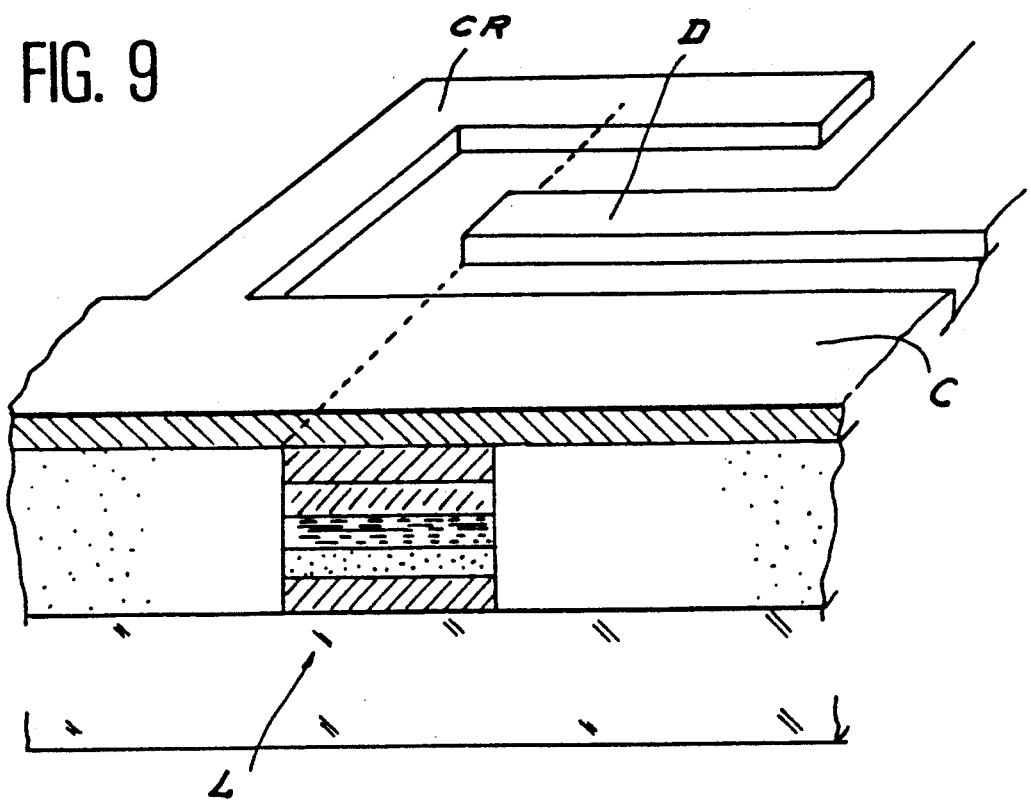
FIG. 9 in perspective, the detail of the overlap zone of a stacking row and a column in section parallel to a column.

FIG. 9 shows, in perspective, the overlap zone of a row L and a column C, a crook CR and a finger D.

Figure 10:
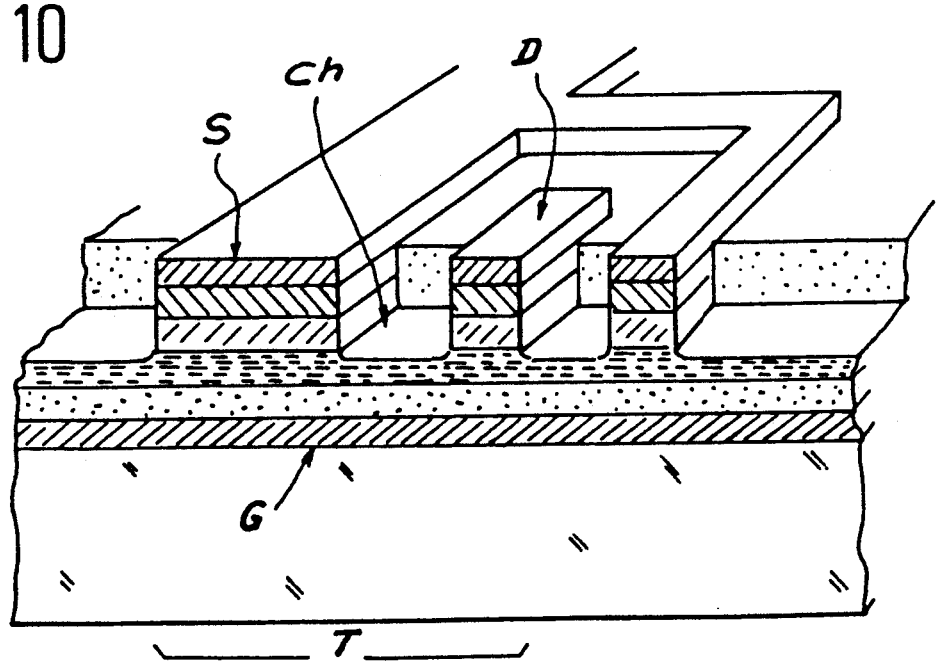
FIG. 10 a section along a row after the etching of the upper layers of the stack.

For illustrative purposes, the dimensions can be column width 20 $\mu$m, finger width 8 $\mu$m, crook width 8 $\mu$m, gaps between the finger and column and finger and crook 8 $\mu$m. This is followed by the etching of the upper metal 20 and the doped silicon 18 in order to define the transistor channel. This etching is carried out through the system of column fingers and optionally crooks. The result is shown in perspective in FIG. 10. This etching leaves behind the polyimide.

This gives a transistor T with the finger constituting the drain D, the column constituting the source S, the row constituting the gate G and the zone between the column and the finger constituting the channel Ch. In the variant with the crook illustrated in FIG. 10, a double transistor with a common drain is obtained.

A passivating layer, e.g. of silicon nitride, may cover the assembly obtained.

Figure 11:
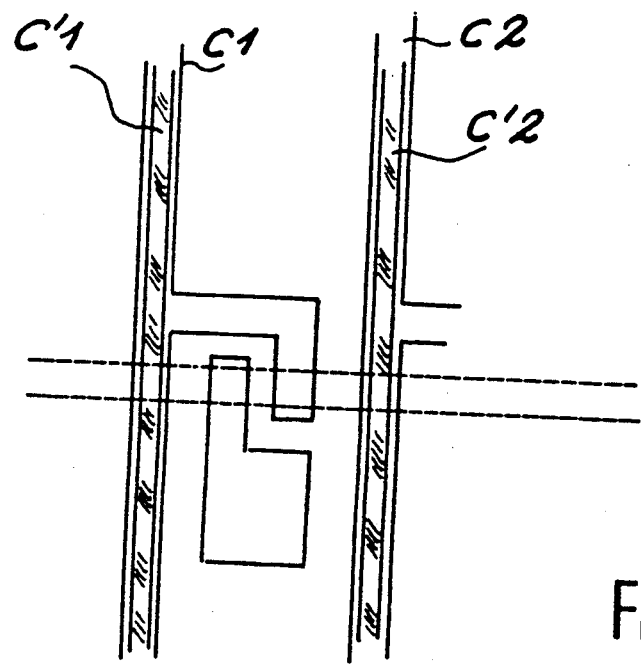
FIG. 11 a variant in which the columns are partly covered by metallic columns.

In another advantageous variant illustrated in FIG. 11, it is possible to deposit on each conductive transparent column C1, C2, etc., a highly conductive metallic column C'1, C'2, etc. Thus, the conductive transparent material such as tin-indium oxide is relatively resistive (approx. 10 Ohm$^2$), which limits the side dimension of the screens to approximately 10 centimeters. The use of supplementary metallic columns would make it possible to overcome this effect, whilst ensuring a redundancy in the case of a column cutoff.

In order to avoid alignment problems, the width of the metallic columns is advantageously smaller than that of the ITO columns. Naturally, this variant requires a third masking level.

The preceding operations make it possible to obtain one of the two walls of a display screen. It is then necessary to produce the other wall, which causes no problem because it is merely a simple glass plate covered by a counterelectrode. The walls are then positioned facing one another separated by a shim. The liquid crystal is then introduced into the thus defined space. It can be seen that the process according to the invention has numerous advantages, particularly its simplicity (two masking levels) and reliability (planarization of the intermediate surface avoiding cutoffs). It makes full use of the advantages inherent in the inverted structure. It is known that in PECVD, the quality of the amorphous silicon layer is influenced by the nature of the support. In the normal structure (gate at the top), the silicon is deposited on the glass and the ITO and the resulting mobilities are limited being approximately 0.2 cm$^2$/Vs. However, in the inverted structure, the silicon is deposited on a silicon nitride layer, which is much more favourable. Thus, the Applicants have been able to measure more than twice higher mobilities (approximately 0.5 cm$^2$/Vs).

In addition, the inverted structure makes it possible to use a greater doped semiconductor thickness (e.g. 100 instead of 30 nm), which improves the source and drain contacts of the transistor.

Finally, the metallic gate layer insulates the "noble" materials (silicon nitride, amorphous silicon and doped silicon) from the glass. A soda-lime float glass, i.e. relatively inexpensive, would be suitable, which is not the case with the "normal" structure and the gate at the top.

We claim:

1. Process for producing a wall for an active matrix display screen, characterized in that it comprises depositing in sequence on a transparent substrate (10) a stack of layers constituted by a first metallic layer (12), an insulating layer (14), a semiconducting layer (16), a highly doped semiconducting layer (18) and optionally a second conducting layer (20), a first photoetching takes place through a first masking level so as to only leave behind stack lines (L1,L2,L3, etc.), the stack lines are then is covered with negative photosensitive material (22) in order to obtain, between the stack lines, a layer having a thickness equal to that of said stack, the resultant structure is irradiated through the transparent substrate (10), the first metallic layer (12) of the stack rows serving as an opaque mask, the non-irradiated resin located above the stack rows is removed, said resin only being left between the stack rows (L1,L2, etc.), followed by planarization of the structure and annealing of the resin, a transparent conductive layer (30) is deposited on the structure and said layer undergoes photoetching to form a second masking level, defining columns and blocks provided with a finger parallel to the columns, the columns and block fingers overlapping the stack rows (L1,L2,L3 etc.) and the columns and blocks, as well as the fingers of the latter, are used as a mask for etching the second metallic layer (20) and the doped semiconducting layer (18), which leaves transistors (T) having as gate (G) the first metallic layer (12) deposited on the substrate, as the drain (D) the block finger, as source (S) the column and as channel (Ch) the semiconducting layer (16) beneath the etched zone between the column and the block finger.

2. Process according to claim 1, characterized in that the metal of the first metallic layer (12) is chosen from the group consisting of chromium, tantalum, molybdenum and tungsten.

3. Process according to claim 1, characterized in that the insulant of the insulating layer (14) is silicon nitride (SiN) and that the semiconductor of the semiconducting layer (16) is amorphous hydrogenated silicon (aSiH).

4. Process according to claim 1, characterized in that the transparent conducting layer (30) is of indium-tin oxide.

5. Process according to claim 1, characterized in that a passivating layer is deposited on the transistors.

6. Process according to claim 1, characterized in that on the transparent conductive material columns is deposited, through a third mask and by a third etching, columns (C'1, C'2 etc.) of metal with a width smaller than that of the columns (C1,C2, etc.) of transparent conductive material.

7. Process according to claim 1, characterized in that the second mask and the second etching also define a crook-shaped segment (CR11,CR12, etc.) emanating from the column (C1,C2, etc.), passing round the end of the finger (D11, etc.) of the block and overlapping the stack lines (L1,L2 etc.) in such a way that after etching two transistors are formed for each pixel, one on either side of the finger and having a common drain.

* * * * *

UNITED STATES PATENT AND TRADEMARK OFFICE
CERTIFICATE OF CORRECTION

PATENT NO. : 5,015,597
DATED : May 14, 1991
INVENTOR(S) : Bruno VINOUZE and Yannick CHOUAN It is certified that error appears in the above-identified patent and that said Letters Patent is hereby corrected as shown below:

Claim 1, Col. 6, line 9, "the" should be deleted, (second occurrence).

Signed and Sealed this

Twelfth Day of July, 1994

*Attest:*

BRUCE LEHMAN

*Attesting Officer*        *Commissioner of Patents and Trademarks*